(12) United States Patent
Kitani

(10) Patent No.: US 7,677,696 B2
(45) Date of Patent: Mar. 16, 2010

(54) LIQUID DISCHARGE HEAD

(75) Inventor: Koji Kitani, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 900 days.

(21) Appl. No.: 11/084,042

(22) Filed: Mar. 21, 2005

(65) Prior Publication Data

US 2005/0221523 A1    Oct. 6, 2005

(30) Foreign Application Priority Data

Mar. 31, 2004    (JP)    ............... 2004-101842

(51) Int. Cl.
B41J 2/01    (2006.01)
(52) U.S. Cl. ...................................... 347/45
(58) Field of Classification Search ......... 438/149–164, 438/21; 347/44, 45, 46
See application file for complete search history.

(56) References Cited

U.S. PATENT DOCUMENTS

| | | | | |
|---|---|---|---|---|
| 3,812,019 | A * | 5/1974 | Needham et al. | 205/125 |
| 4,803,580 | A * | 2/1989 | Mowry | 360/317 |
| 4,827,289 | A * | 5/1989 | Tsuji et al. | 347/203 |
| 5,229,789 | A * | 7/1993 | Kishida et al. | 347/209 |
| 5,275,695 | A * | 1/1994 | Chang et al. | 216/27 |
| 6,051,485 | A * | 4/2000 | Schindler et al. | 438/577 |
| 6,100,547 | A   | 8/2000 | Matsushita | 257/192 |
| 6,435,660 | B1* | 8/2002 | Ozaki et al. | 347/45 |
| 6,441,838 | B1* | 8/2002 | Hindman et al. | 346/63 |
| 6,594,899 | B2* | 7/2003 | Maze et al. | 29/890.1 |
| 6,605,519 | B2* | 8/2003 | Lishan | 438/555 |
| 7,279,825 | B2* | 10/2007 | Ifuku et al. | 310/358 |
| 2003/0113985 | A1 | 6/2003 | Murai et al. | 438/574 |
| 2003/0116528 | A1* | 6/2003 | Bernstein et al. | 216/2 |
| 2004/0119789 | A1* | 6/2004 | Usami et al. | 347/63 |
| 2006/0110928 | A1* | 5/2006 | Degroote | 438/719 |

FOREIGN PATENT DOCUMENTS

| | | |
|---|---|---|
| JP | 55-9415 A | 1/1980 |
| JP | 4-111422 A | 4/1992 |
| JP | 05-254122 | 10/1993 |
| JP | 05-301345 | 11/1993 |
| JP | 07-125208 | 5/1995 |
| JP | 07-273280 | 10/1995 |
| JP | 09-104112 | 4/1997 |
| JP | 11-87368 A | 3/1999 |
| JP | 2000-91348 A | 3/2000 |

* cited by examiner

Primary Examiner—Evan Pert
Assistant Examiner—Kenisha V Ford
(74) Attorney, Agent, or Firm—Fitzpatrick, Cella, Harper & Scinto

(57) ABSTRACT

In order to suppress peeling of a film formed on a base, and improve the durability and reliability of the film, an overhang is provided on a side surface of a sacrifice layer, whereby a film is formed, which has an edge portion having a thickness distribution, in which a thickness is gradually decreased to substantially zero at an edge of a formed film.

1 Claim, 8 Drawing Sheets

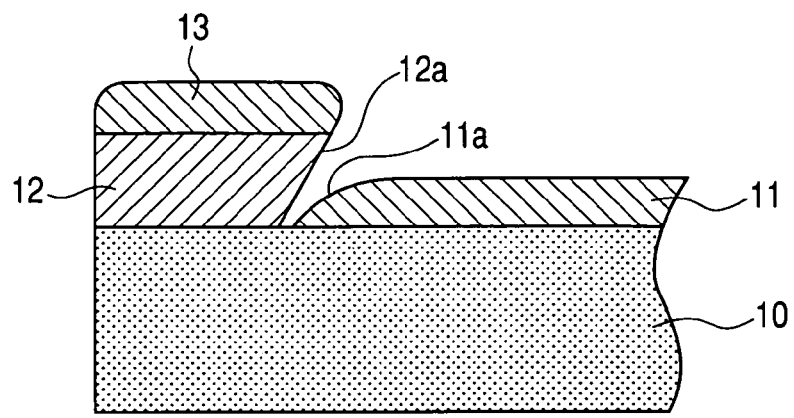
FIG. 2A
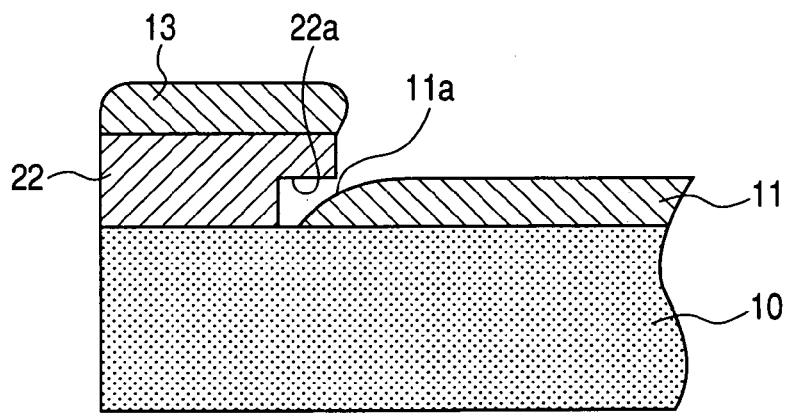
FIG. 2B
FIG. 3
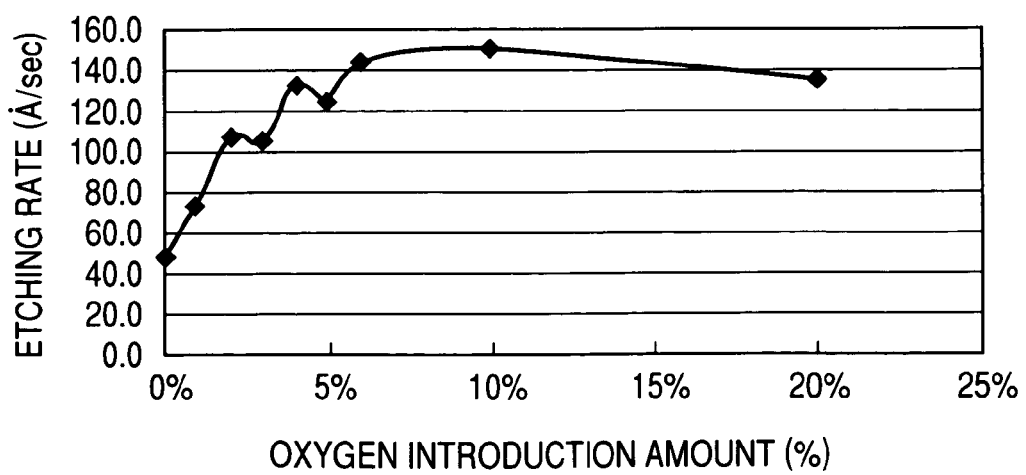

LIQUID DISCHARGE HEAD

BACKGROUND OF THE INVENTION

1. Field of the Invention

The present invention relates to: a film formation method for a film used for an element substrate of a liquid discharge head and a substrate on which semiconductor devices, electronics devices, or the like are mounted; a substrate having a base formed with the film, and a liquid discharge head.

2. Related Background Art

A vacuum evaporation method, sputtering method, and the like have been generally used as methods of forming a thin film. However, there is a problem in that, although depending on a film formation material, a metal thin film, which is particularly made of a material that is chemically stable and excellent in corrosion resistance, for example, a noble metal, is apt to be peeled off because the film has a weak adhesive force with respect to an opposing material, which forms a film formation base, such as SiN, Si, or SiO.

Thus, in order to raise an adhesion strength of the film, there have been introduced physical improvements, which aim at anchor effects, such as optimization of pretreatment for a base, usage of a contact metal, improvement of diffusion which is based on film formation conditions such as a heating temperature, reduction in stress, and increase of surface roughness.

However, in actuality, the improvements are not sufficient in many cases, and peeling is likely to occur from an edge of a pattern opening. Thus, the further improvements for the adhesion strength have been required.

FIG. 5A shows a method in which a pattern opening is formed on a metal thin film 101 on a base 100 through conventional wet etching. A resist 102 is applied onto the metal thin film 101 formed on the base 100, and the resultant is immersed into an etchant from the patterned resist opening to etch the metal thin film 101, thereby forming the pattern opening. Wet etching is isotropic etching. Therefore, an end surface 101a of the pattern opening of the metal thin film 101 corresponds to a surface formed by joining points equidistant from an edge 102a of the resist opening.

FIG. 5B illustrates the case where patterning is performed by conventional dry etching. A metal thin film 111 is formed on the entire surface of a base 110 by sputtering or the like, a photoresist pattern 112 is formed thereon, and then, a pattern opening is formed by reactive ion sputtering (RIE) or sputtering etching with an Ar gas. In the reactive ion sputtering, a reaction gas (chlorine gas, carbonyl chloride, or the like), which combines with a metal as an etching object, is introduced to perform etching through reaction. Thus, an end surface 111a of the pattern opening of the metal thin film 111 can be gentle to some extent in comparison with FIG. 5A. However, a metal material for the film and a selective ratio (an etching rate of the metal thin film 111/an etching rate of the base 110) are limited, and thus, even the base 110 is slightly subjected to etching, which produces a recessed portion 110a. This tendency is conspicuous particularly in the case of a noble metal that is hard to have its selective ratio.

Further, as shown in FIG. 6A, in the case where an adhesion layer 121 is interposed between the base 110 and the metal thin film 111, the adhesion layer 121 is exposed at the end surface 111a of the pattern opening in the above-mentioned dry etching. A material with high reactivity, for example, Ti, Cr, Ni, or Ta is used for the adhesion layer 121. Therefore, the adhesion layer 121 may be dissolved into a kind of agent from the exposed portion, or may cause reaction such as oxidation, and the resultant permeates the inside, which leads to damage of the adhesion layer 121.

FIG. 6B shows a metal thin film 131 formed by patterning through conventional mask film formation. The mask film formation is performed in the state in which a mask 132 with a limited thickness, which is opened at its portion for film formation, is adhered to a base 130. An amount of sputtered particles that fly through sputtering is determined in accordance with the so-called cosine law in which the amount is proportional to cos θ with respect to an angle θ at which the particles are emitted. The amount is maximum at an incident angle of 0°, and is gradually decreased along with the increase of the angle. Therefore, in the case where a side surface of the mask 132 is vertical to the base, a thickness is gradually decreased in an end portion 131a of the metal thin film 131. However, half of the maximum thickness is left at an edge of the film because the edge contacts with the side surface of the mask 132.

Further, patterning through lift-off is known as a modified example of mask film formation. On one hand, in mask film formation, detachment/attachment of a mask is carried out mechanically; on the other hand, in lift-off, a sacrifice layer pattern is provided on a base, a metal thin film is formed thereon, and then, the sacrifice layer pattern is dissolved. In general, the sacrifice layer pattern is formed of a photoresist, and the metal thin film is formed of a desired material to be thinner than the sacrifice layer. Then, a step between the sacrifice layer pattern and the metal thin film is utilized, thereby etching the sacrifice layer from a gap therebetween. As a result, the sacrifice layer pattern and the metal thin film attached thereon are removed together.

However, in the case where the metal thin film made of, for example, a noble metal, is formed, the film formation temperature is high, and thus, a resin resist cannot be used for the sacrifice layer. Further, there has been pointed out, for example, a problem in that the sputtered particles partially destroy the resist pattern, which degrades pattern precision. In order to solve this problem, there is proposed, in Japanese Patent Application Laid-Open No. H07-273280, lift-off with the use of an inorganic sacrifice layer pattern made of Al that is a metal easy to etch.

However, according to the method disclosed in Japanese Patent Application Laid-Open No. H07-273280, the Al sacrifice layer pattern has a rectangular sectional shape, and has a side surface vertical to a base. Thus, when being formed thereon, a metal thin film has half of the maximum thickness at its film edge as in the mask film formation. Further, sputtered particles attach to the side surface of the Al sacrifice layer pattern. Thus, even if an etchant permeates from a thin part of the metal thin film to dissolve Al, the metal thin film is not sufficiently cut between the base and an upper surface of the sacrifice layer pattern. Accordingly, an unnecessary part of the metal thin film needs to be forcedly peeled off.

Further, any conventional element substrate of a liquid discharge head, which ejects a liquid such as ink through utilization of heat energy and which is mounted on a recording device, has a heating resistor (heater) having a heat effect portion. A protective film for the heating resistor needs to have: insulating property that insulates, for example, ink from the heating resistor; corrosion resistance against ink at high temperature; and cavitation resistance against impact of cavitation at the time of disappearance of bubble. Thus, it is general that the heating resistor is protected against a usage environment by means of a protective layer having a two-layer structure in which: an insulating protective film, which is made of $SiO_2$, SiC, SiN, or the like, is formed on the heating resistor; and a protective film with cavitation resistance/corrosion resistance, which is made of Ta or the like, is formed thereon.

It is disclosed in, for example, Japanese Patent Application Laid-Open No. H05-254122 that: a noble metal such as Ir (iridium), Pt (platinum), or Ru (ruthenium) is adopted for the protective film as a material with high corrosion resistance; and this realizes a mechanical strength equal to or larger than that in the conventional one made of Ta (tantalum) and the durability against ink approximately twice or three times the durability in the case of Ta, which achieves twice or three times longer life than the conventional case. However, in the present condition, it is difficult to form a noble-metal thin film into a predetermined pattern, as a result of which manufacturing at low cost has not been realized.

SUMMARY OF THE INVENTION

An object of invention is to suppress peeling of a film formed on a base, and improve the durability and reliability of the film according to the invention, an overhang is provided on a side surface of a sacrifice layer, whereby a film is formed, which has an edge portion having a thickness distribution, in which a thickness is gradually decreased to substantially zero at an edge of a formed film.

BRIEF DESCRIPTION OF THE DRAWINGS

FIGS. 1A, 1B and 1C are views for explaining Example 1, in which: FIGS. 1A and 1B are partial sectional views each showing a shape of an end portion of a metal thin film; and FIG. 1C is a view for explaining a sectional shape of a sacrifice layer pattern for lift-off;

FIGS. 2A and 2B are views showing a case where film formation is performed with a sacrifice layer pattern having an overhang with an inverted taper shape and a case where film formation is performed with a sacrifice layer pattern having an overhang of a step, respectively;

FIG. 3 is a graph showing change of an etching rate to a mixed acid in the case of introduction of oxygen at the time of Al film formation;

DETAILED DESCRIPTION OF THE PREFERRED EMBODIMENTS

Figure 1A:
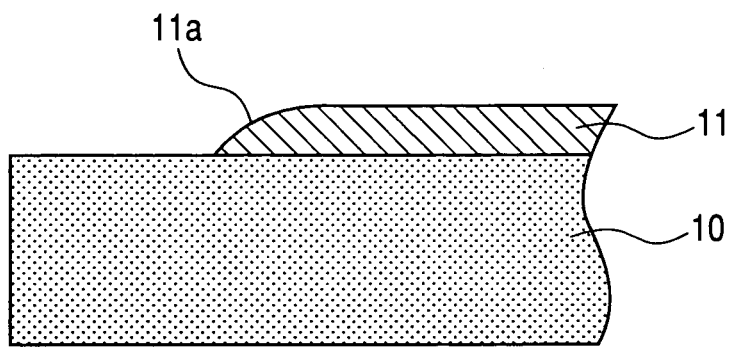

In the prior art, there has been an unsolved problem in that: peeling is apt to occur from an edge of a formed film; and a noble metal thin film, which is suitable for a protective film or the like of a liquid discharge head, is difficult to pattern.

The present invention has been made in view of the unsolved problem in the prior art, and therefore has an object to provide: a film formation method in which provision of an edge portion having a thickness distribution, in which a thickness is gradually decreased to substantially zero at an edge of a formed film, enables low-cost formation of a thin film, which does not tend to be peeled off and is excellent in durability; a substrate; and a liquid discharge head.

From the examination of a mechanism of peeling of a formed thin film, it has been found that: peeling of the film is caused by a force larger than an adhesive force; and a film stress that relatively acts on between a film and a base is the cause of peeling in a semiconductor device, electronics device, and the like although the action that results from an external force is also regarded as the cause in a mechanical component.

The film stress of compression/tension remains in the film formed by a method such as sputtering or evaporation in accordance with materials and conditions. The film stress differs depending on a material, temperature at the time of film formation, and heat treatment after film formation. However, there are limitations on the respective parameters, and in effect, the parameters cannot be changed because they affect film qualities such as packing density and crystallinity.

In the case where a tensile stress works as the film stress in an interface of a film with limited and uniform thickness and stress, a shearing tensile stress at the interface between the film and the base is obtained by multiplying a film stress by a sectional area in a thickness direction. The tensile stress is equivalently and omnidirectionally applied to a center portion of the film. Thus, the film is not peeled off from the center portion because of a balanced force at the interface unless there is initial distortion. However, the shearing force becomes larger from the center to the film edge, and is at its maximum at the edge because the film is pulled only by the inside. Therefore, it is considered that peeling of the film tends to occur from the film edge. Further, when the film starts to be peeled, the force in a shearing direction becomes larger at the interface in the end portion. Also, the tensile stress in the direction vertical to the interface is also applied onto the film depending on the shape of the peeled film. Thus, peeling progresses successively, as a result of which the entire film is peeled.

In view of the above, it is important first that peeling at the film edge is prevented from occurring in order to avoid film peeling without the change of the parameters on the film qualities such sputtering conditions. As the measure for dealing with this point, an edge portion is provided in which a thickness thereof is gradually decreased toward its film edge even with the same film stress, which gradually reduces the tensile stress in the shearing direction at the interface in the end portion. Further, the thickness is gradually decreased to substantially zero, which realizes the tensile stress in the shearing direction of zero at the film edge.

Description will be made of an embodiment of the present invention with reference to the accompanying drawings.

An example for which the present invention is suitably used is formation of a metal thin film, which requires a strong adhesive force, or of a noble metal thin film made of Pt, Ir, Os, Ru, or Ni.

Figure 9B:
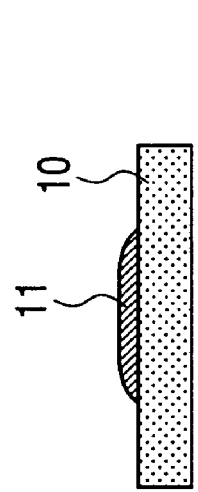
FIGS. 9A, 9B, 9C and 9D are schematic diagrams in which a metal film is formed by lift-off in this embodiment.
Figure 9C:
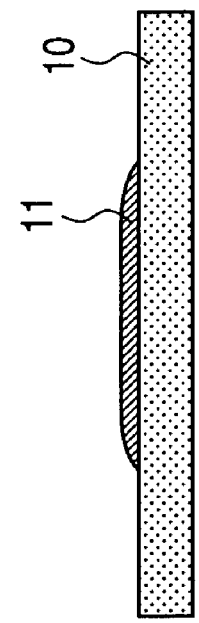
Figure 9D:
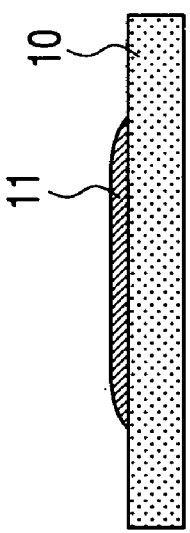
Figure 9A:
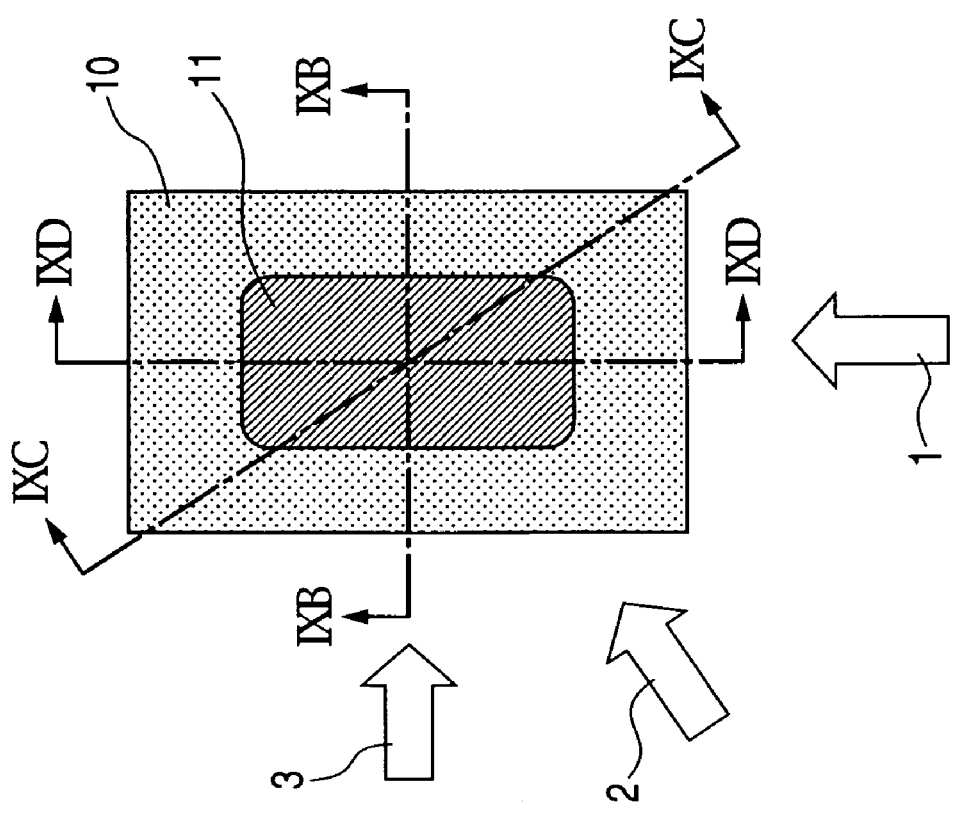

FIGS. 9A to 9D each show a state in which a metal film 11 as a thin film is formed on a base 10 by lift-off with the use of this embodiment. FIG. 9A is a schematic diagram seen from an upper surface of the base; FIG. 9B is a schematic sectional view with an arrow 1 which is taken along a line IXB-IXB in FIG. 9A; FIG. 9C is a schematic sectional view with an arrow 2 which is taken along a line IXC-IXC in FIG. 9A; and FIG. 9D is a schematic sectional view in an arrow 3 which is taken along a line IXD-IXD in FIG. 9A.

The metal film in this embodiment takes a shape in which a thickness is gradually decreased toward to an end portion in the entire circumference of the metal film 11, as understood from the sectional views in FIGS. 9B to 9D. The details will be described in the explanation of FIGS. 1A to 1C. Further, if a formed metal film has corners, peeling of the film is apt to occur from the corner portions. Therefore, in this embodiment, the metal film on the surface on which the metal film is formed on the base is formed to have radiuses (roundness) at the corners, as shown in FIG. 9A. That is, when seen from the upper surface of the base, the metal film has a shape without corners. This can be dealt with by making radiuses at corners of an Al pattern, which is a sacrifice layer pattern, in the lift-off film formation.

Figure 1B:
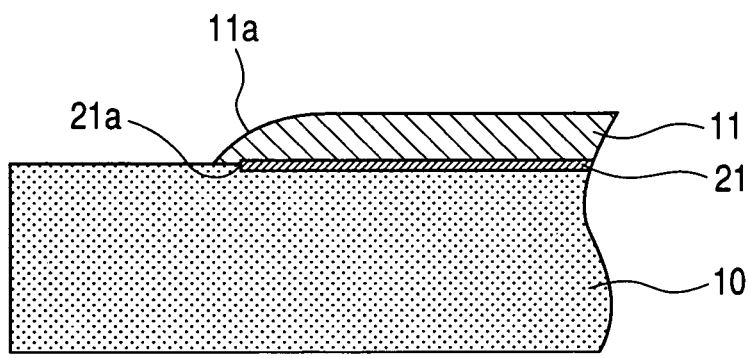

In this embodiment as described above, a structure is provided in which the entire metal film 11 is difficult to be peeled. Therefore, the metal film with high reliability can be formed. FIG. 1A is an enlarged sectional view of the metal film 11 in this embodiment. The metal thin film 11 has an edge portion 11a of which thickness is gradually decreased from a target thickness at its center portion to substantially zero at its film edge in accordance with the known cosine law. Further, as shown in FIG. 1B, in the case where an adhesion layer 21 is interposed between the base 10 and the metal thin film 11, the edge portion 11a is formed so as to cover a film edge 21a of the adhesion layer 21. A material with high reactivity such as Ti, Cr, Ni, or Ta is suitably used for the adhesion layer 21. In this embodiment, the end portion of the adhesion layer is covered by the edge portion 11a of the metal film 11. Therefore, it can be avoided that the adhesion layer is damaged by being dissolved into a kind of agent or causing reaction such as oxidation.

Figure 1C:
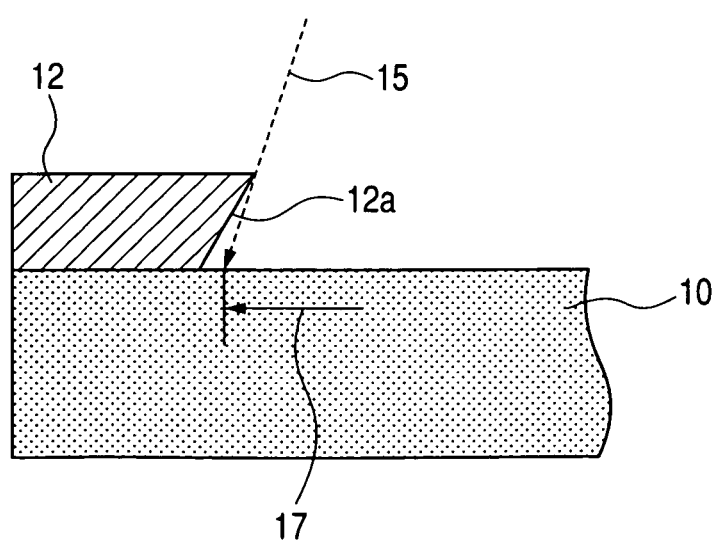

The metal thin film 11 having the edge portion 11a of which thickness is gradually decreased can be formed by lift-off with the use of an Al pattern 12, which is a sacrifice layer pattern of which side surface has an overhang formed by an inverted taper portion 12a, as shown in FIG. 1C.

That is, sputtering has an angular distribution in a direction in which deposition particles are incident on the base. In order to form the edge portion 11a, it is sufficient that the side surface of the Al pattern 12 has a sectional shape having the inverted taper portion 12a that casts a shadow to the incident direction with the purpose of preventing the deposition particles from attaching to the side surface of the Al pattern 12. Instead of the lift-off film formation, there can be adopted mask film formation with the use of a mask having the same sectional shape as that of the Al pattern 12.

A taper angle of the inverted taper portion 12a of the Al pattern 12 is set to have a value larger than the maximum value of an incident angle of the deposition particles which is shown by a broken line 15. The distribution of amounts of sputtered particles in accordance with the incident angle differs depending on apparatuses and film formation conditions such as a distance from a target, collimator, and deposition power.

With respect to the base 10 such as an Si wafer, the taper angle of the Al pattern 12 of which side surface has an inverted taper shape has the value larger than the maximum value of the incident angle of the deposition particles. Thus, an outer end of a region, where the deposition particles incident from an opening portion of the Al pattern 12 contact with the base 10, that is, a deposition end portion (film edge) 17 is located outside an opening end of the Al pattern 12. Accordingly, immediately after sputtering, the metal thin film 11 is formed on an exposed surface of the base 10, and a metal thin film 13 is stacked on the Al pattern 12, as shown in FIG. 2A.

Figure 7:
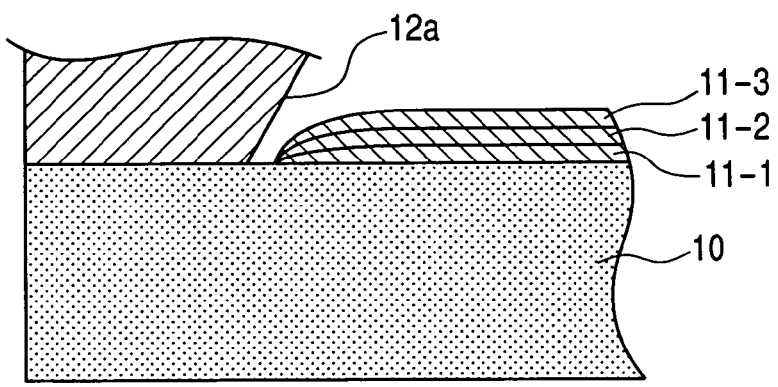
FIG. 7 is a schematic diagram of a process of forming a metal film in this embodiment.

Here, FIG. 7 is a schematic diagram of a process of forming a metal film. A metal film 11-1, metal film 11-2, and metal film 11-3 show the state in which the metal film is being formed with a lapse of time. As shown in the figure, also in the film under formation, its edge portion has a shape in which a thickness is gradually decreased in accordance with the cosine law. Thus, the stress in the film is hard to be generated even in the formation of the film.

As the sacrifice layer pattern, an Al pattern 22 may be used which has an overhang formed by a step 22a instead of an inverted taper shape, as shown in FIG. 2B. The metal thin film 13 on the Al pattern 12, 22 is removed by etching the Al pattern 12, 22. Resultingly, there can be formed the metal thin film 11 provided with the edge portion 11a of which thickness is gradually decreased to substantially zero toward the film edge.

In the case of providing the adhesion layer 21 as shown in FIG. 1B, a material, which improves adhesive property, such as Ti or Cr is sputtered in advance on the base 10 having the Al pattern 12 shown in FIG. 1C, thereby forming the adhesion layer 21, and thereafter, a film material to be the metal thin film 11 is sputtered thereon to be thicker than the adhesion layer 21. Accordingly, a two-layer film can be obtained which has a structure in which the metal thin film 11, which has the thickness distribution in accordance with the cosine law, covers the adhesion layer 21.

Figure 10A:
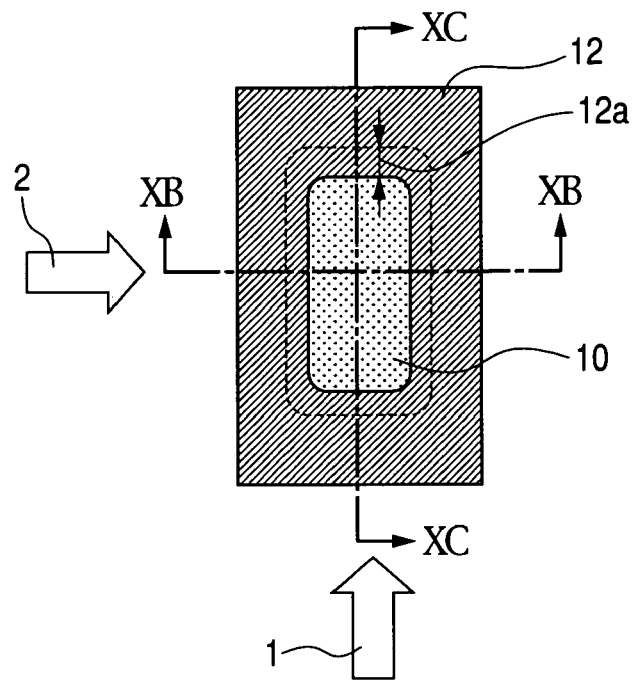
FIGS. 10A, 10B and 10C are schematic diagrams each showing a sacrifice layer pattern in this embodiment.
Figure 10B:
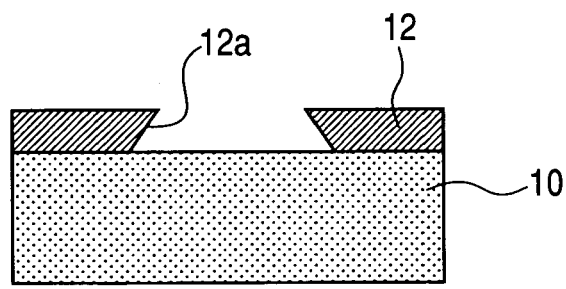
Figure 10C:
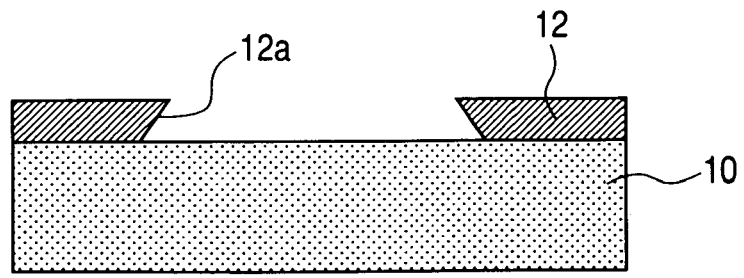

FIGS. 10A to 10C are schematic diagrams each showing the sacrifice layer pattern for forming the metal film. FIG. 10A is a schematic diagram seen from the upper surface of the base; FIG. 10B is a schematic sectional view with an arrow 1 which is taken along a line XB-XB in FIG. 10A; and FIG. 10C is a schematic sectional view with an arrow 2 which is taken along a line XC-XC in FIG. 10A.

As shown in the figures, the sacrifice layer pattern is provided with the overhang 12a such that the edge portion has a thickness that is gradually decreased in accordance with the cosine law in the entire circumference of the metal film to be formed. Further, radiuses are made at corners of the sacrifice layer pattern seen from the upper surface of the base. As a result, the radiuses are provided at the corners of the metal film as shown in FIG. 9A, which realizes a structure in which the entire metal film 11 is difficult to be peeled off.

As described above, the metal thin film having the edge portion, of which thickness is gradually decreased to substantially zero toward the film edge, can be obtained also by the mask film formation with the use of the mask having the overhang formed by the inverted taper portion or step. However, even if alignment between the mask and the base, distortion at the time of heating deposition, positional deviation due to the difference of thermal expansion, and the like are compensated with a material for the mask and process optimization, the lift-off with the use of an inorganic resist such as the Al pattern is superior in terms of edge positional accuracy in film formation because the mask itself is thick.

The formation of the sacrifice layer pattern formed of the inorganic resist such as the metal, which is used for the lift-off film formation, is performed with the following procedure. The sacrifice layer pattern has the overhang having the inverted taper shape or the like, and is formed with the following procedure.

(1) A multi-layer structure, which includes a lower layer formed of a material with a higher etching rate and an upper layer formed of a material with a relatively lower etching rate with respect to the same etchant, is formed on a base.

(2) A resist with resistance against the etchant is patterned thereon.

(3) Etching is performed with the etchant. Since etching progresses faster in the lower layer, there is formed the overhang having the inverted taper shape or the like.

EXAMPLE 1

First, a graph in FIG. 3 shows the result of measurement of an etching rate of an aluminum oxide film, which is formed by reactive sputtering through introduction of oxygen into an Ar sputtering gas with the use of an Al target, to a mixed acid (phosphoric acid:acetic acid:nitric acid:water=15:1:1:1, 40° C.). This graph shows that the etching rate becomes larger with the increase of an introducing amount of oxygen, and reaches the maximum value with an introducing amount of 10%.

Figure 11A:
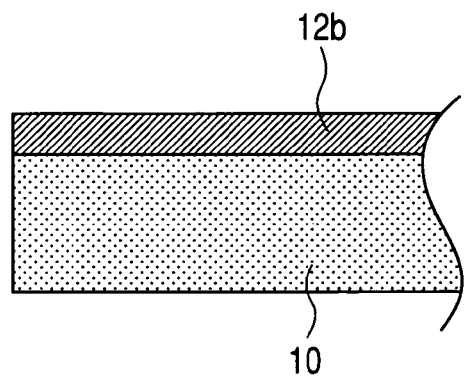
FIGS. 11A, 11B, 11C and 11D are views showing the steps of forming a sacrifice layer pattern made of an inorganic resist in this embodiment.
Figure 11B:
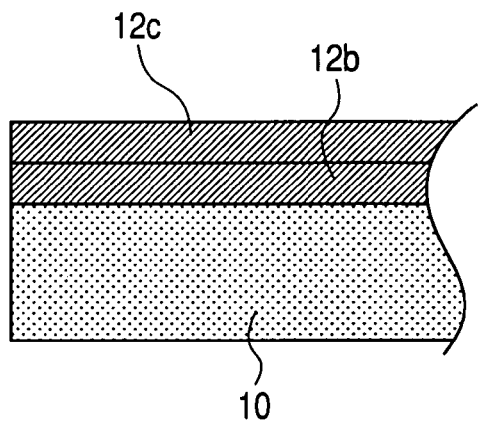
Figure 11C:
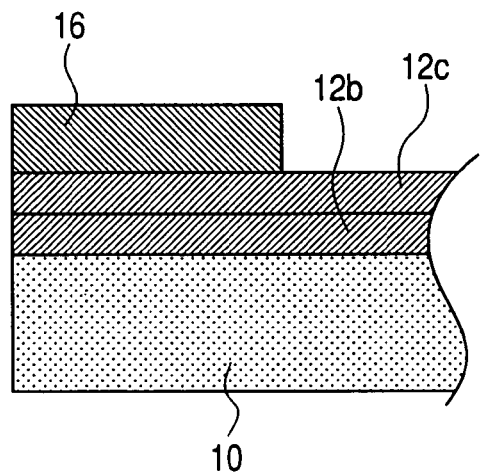
Figure 11D:
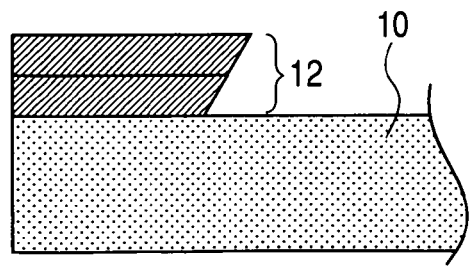

As shown in FIG. 11A, formed on an Si wafer as a base was an aluminum oxide layer 12b with a thickness of about 300 nm, which served as a lower layer, with an oxygen introducing amount of 10%. Successively, an Al layer 12c as an upper layer was formed to have a thickness of about 300 nm with the use of only the Ar sputtering gas, as shown in FIG. 11B. A photoresist was applied thereon to have a thickness of 1 to 2 μm to be patterned, thereby forming a resist pattern 16, as shown in FIG. 11C. Further, etching was performed with the mixed acid. After the Al layer disappeared in viewing, and then, the base surface of the Si wafer was seen, over-etching was performed for 30 seconds. When the section of this sample view of FIG. 11D was observed by means of an SEM, the Al pattern 12 having an inverted taper shape was confirmed. Note that it was also confirmed that a taper angle could be adjusted by changing the time for over-etching.

The Al pattern was formed on the base comprised of the Si wafer through the above steps, a Ti film with a thickness of 10 nm was formed as an adhesion layer, and an Ir film as a metal thin film was formed thereon to have a thickness of 200 nm.

When the section was observed by the SEM, it was confirmed that: the film did not attach to a side surface of the Al pattern as a sacrifice layer; and an edge portion, of which thickness was gradually decreased to substantially zero as shown in FIG. 1B, was formed at an end portion of the Ir film.

The resultant was subjected to etching through immersion into a mixed acid for the time determined by the size of the Al pattern and the etching rate. Then, the resultant was subjected to pure water cleaning, and thereafter to cleaning drying by means of a rinsing shower dryer.

From the observation in this state, a part of the Al pattern to be eliminated and an unnecessary part of the Ir layer were not separated from the base, which was probably caused by absorption due to water. Thus, an adhesion tape (ELEPHOLDER V-8M (commercial name, manufactured by NITTO DENKO CORPORATION) was adhered to the base to peel the parts. As a result, all the parts could be removed. It has been confirmed that the parts can be removed also by a means such as ultrasonic cleaning. However, removal through adhesion, which requires a smaller force applied on the Si wafer, is more excellent.

Further, the following has been found on a proper amount of an inverted taper. When over-etching is performed insufficiently, an inverted taper angle becomes small. Thus, deposition particles start to be attached to the side surface of the Al pattern as the sacrifice layer. When lift-off is performed in this state, the film on the sacrifice layer connects with the film formed on the base, which makes the removal difficult. Further, the film edge has a thickness, and thus, there arises not only a problem in that a tensile stress cannot be relaxed sufficiently but also a problem in that the Ti film as the adhesion layer is exposed to the surface, which deteriorates corrosion resistance. On the contrary, when over-etching is performed excessively, the overhang of the sacrifice layer pattern becomes thin and long. Thus, a tip end of the overhang droops onto the base, and then, the formed film connects the sacrifice layer pattern with the base. Resultingly, lift-off cannot be performed.

EXAMPLE 2

An example is shown in which the present invention is applied to an endurance protective film for a liquid discharge head used for a liquid ejecting recording system in which a liquid such as ink is ejected from a discharge port to form pixels on a material to be printed.

Figure 12:
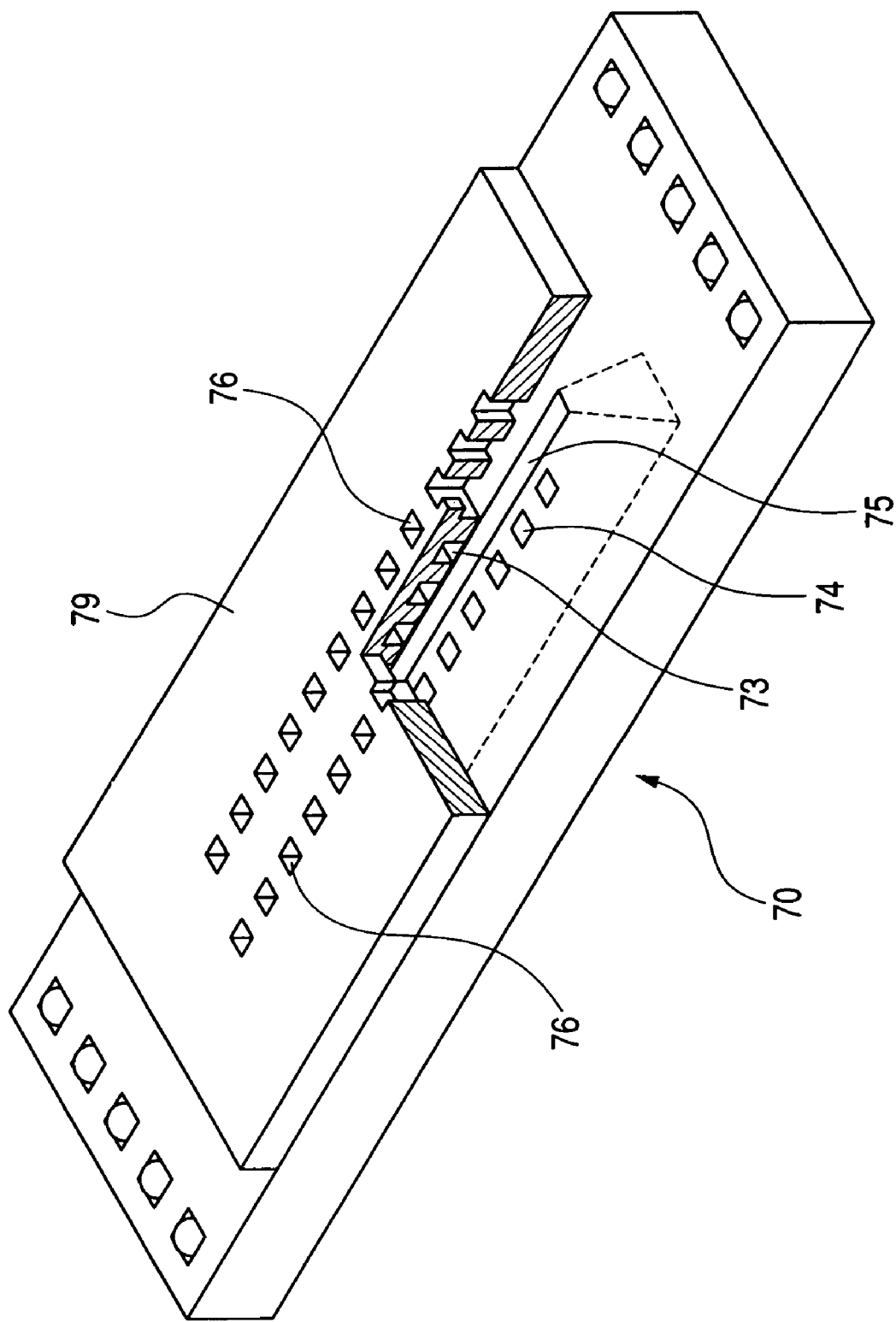
FIG. 12 is a schematic diagram of a liquid discharge head in this embodiment.

FIG. 12 is a schematic diagram, which has a partial sectional portion, of a liquid discharge head 70.

Arranged on a substrate made of Si or the like are heaters 74, which are heating elements, as energy generators. Ink chambers 73 and discharge ports 76 are provided on a top plate 79 on the Si substrate in correspondence with the heaters 74, respectively. The ink is supplied to the ink chambers 73 from an elongated ink supply opening 75 provided on the Si substrate, thereby being discharged from the discharge ports 76 by means of the heaters 74.

The endurance protective film for the liquid discharge head needs to be excellent in terms of corrosion resistance and adhesive property. Evaluation has been made on durability of the liquid discharge head having the film structure shown in FIG. 4.

Figure 4:
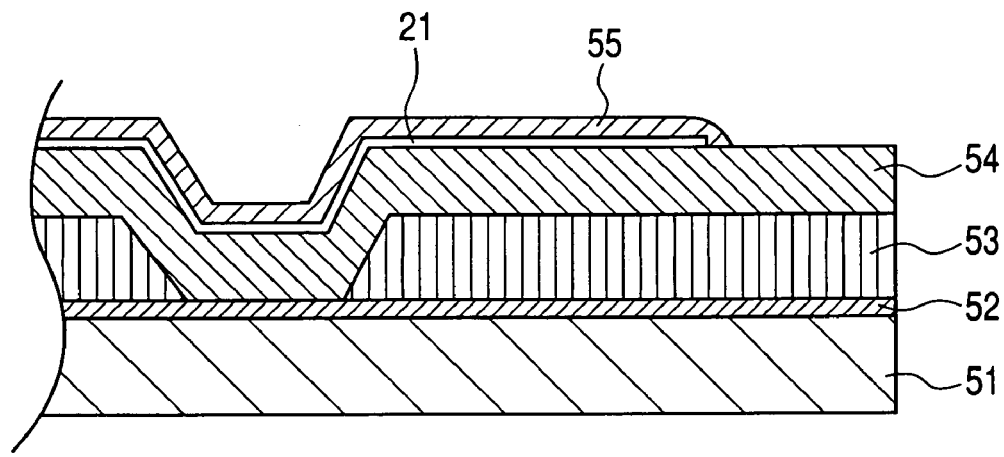
FIG. 4 is a sectional view schematically showing a structure of an element substrate of a liquid discharge head.
Figure 5A:
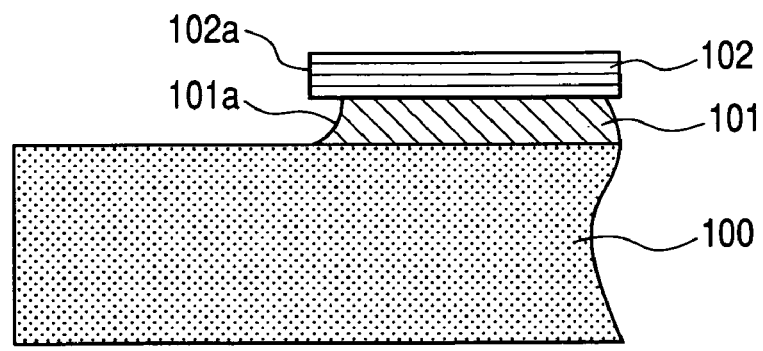
FIGS. 5A and 5B are views showing two conventional examples.
Figure 5B:
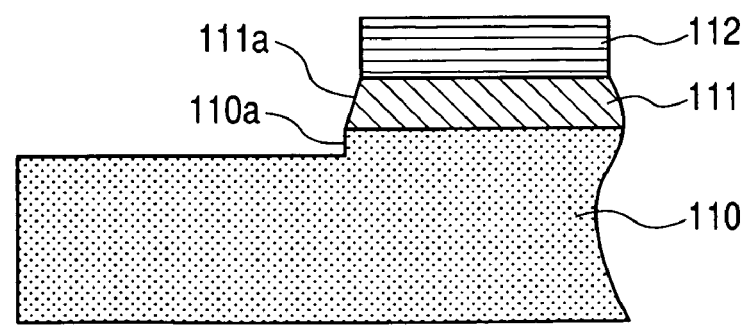
Figure 6A:
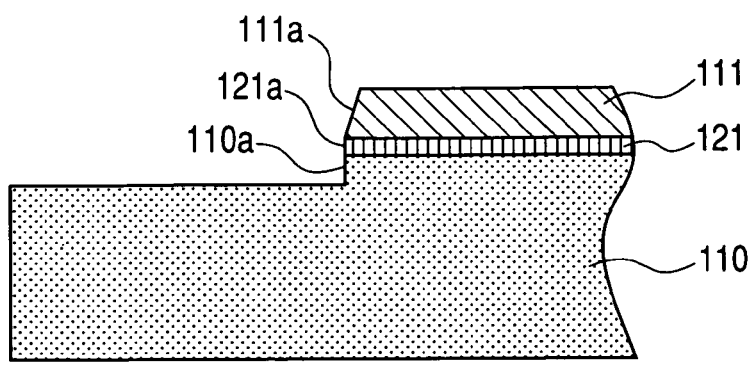
FIGS. 6A and 6B are views showing other two conventional examples.
Figure 6B:
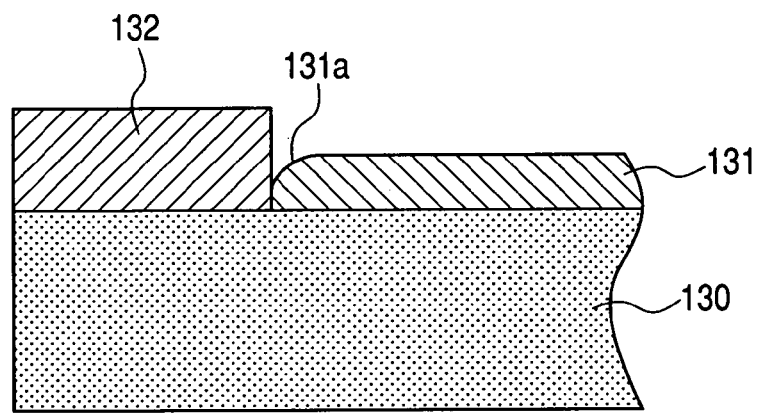

FIG. 4 shows a film structure of an element substrate, which has discharge energy generators, for the liquid discharge head, and is a sectional view of the element substrate. The manufacturing steps of the substrate are as follows. A heating resistor 52 formed of a TaN film and a wiring conductor 53 formed of an Al film are sequentially formed by sputtering on a base 51 comprised of an Si wafer having a base heat accumulating layer. Next, a wiring pattern, which serves as a wiring, and a heating resistor pattern, which serves as an energy generating portion, are formed by photolithography and etching. Thereafter, an SiN film 54, which is an insulating protective film and serves as a first protective film, is formed by CVD. Then, the adhesion layer 21 is formed of Ti, and an Ir metal thin film 55, which is an endurance protective film and serves as a second protective film, is formed by lift-off. That is, the Ir metal thin film 55 is formed by patterning as the second protective film, which needs to have cavitation resistance and the like and covers only the energy generating portion. The end portion of the adhesion layer 21 is covered by an edge portion, of which thickness is gradually decreased to substantially zero, of the metal thin film 55. Thus, it can be avoided that the adhesion layer is dissolved into a kind of agent or causes reaction such as oxidation, which leads to damage.

In the case where the Ta film is used as the second protective film as in the conventional example, dry etching is performed with the use of a chlorine gas. Then, an insulating layer of an Al pad portion, which is used as an external lead terminal to electric wiring, and the second protective film are removed by dry etching. In the case where Ta is used for the second protective film as described above, etching can be performed chemically with the use of a chlorine gas. However, a noble metal such as Ir is chemically stable, and thus, is difficult to be subjected to etching. Therefore, in the liquid discharge head with the film structure shown in FIG. 4, pattern deposition of the Ir film as the metal thin film 55 is performed with the following method.

Liquid discharge heads were manufactured in ten pieces for each of samples A, B, and C. First, formed on an SiN film as a first protective film was an aluminum oxide layer, which served as a lower layer of a sacrifice layer, with a thickness of about 300 nm at an oxygen introducing amount of 10%. Successively, an Al upper layer was formed to have a thickness of about 300 nm with the use of only an Ar sputtering gas. A photoresist was applied thereon to have a thickness of 1 to 2 μm to be patterned, thereby forming a resist pattern. Further, etching was performed with the use of a mixed acid (phosphoric acid:acetic acid:nitric acid:water=15:1:1:1, 40° C.). Over-etching was performed to the samples A, B, and C for 30 seconds, 60 seconds, and 90 seconds, respectively, whereby the Al patterns with different sectional shapes were formed. The photoresist was peeled off by means of a resist peeling solution. Thereafter, for the formation of an adhesion layer, first, a base was subjected to inverse sputtering, and then, a 10 nm-thick Ti film was formed at a deposition pressure of $5 \times 10^{-1}$ Pa, a base temperature of 300° C., and a power of 300 W. Subsequently, as a second protective layer serving as an endurance protective layer, a 200 nm-thick Ir film was formed at a deposition pressure of $7 \times 10^{-1}$ Pa, a base temperature of 300° C., and a power of 1000 W. Thereafter, the resultant was subjected to lift-off with a mixed acid, and then, was subjected to pure water cleaning and to shower rinsing drying. Then, the adhesion tape (ELEPHOLDER V-8M (commercial name, manufactured by NITTO DENKO CORPORATION) was adhered to the resultant to thereby remove the Ir film, which was adhered to the base surface after lift-off. Subsequently, there was formed, for example, a top plate which was formed with an ink chamber and discharge port as known discharge means. Accordingly, the liquid discharge heads were manufactured in ten pieces for each of the samples.

As samples D for comparison, after an SiN film was formed, a 10 nm-thick Ti film and a 200 nm-thick Ir film were formed without providing a sacrifice layer under the same conditions as those for the samples A, B, and C. Thereafter, a photoresist pattern was formed, and sputter etching was performed by means of a milling machine. Successively, the steps for the formation of the ink chamber and the discharge port were conducted. Accordingly, the liquid discharge heads were manufactured in ten pieces.

Further, as samples E for comparison, after an SiN film was formed, an adhesion mask was formed by a 0.2 mm-thick 42Ni, and then, mask film formation was performed. The mask was formed by etching from both sides in terms of precision, and thus, an inverse taper could not be formed.

After the mask adhesion, a 10 nm-thick Ti film and a 200 nm-thick Ir film were formed under the same conditions as those for the samples A, B, and C. Thereafter, the steps for the formation of the ink chamber and the discharge port were conducted. Accordingly, the liquid discharge heads were manufactured in ten pieces.

Based on consideration that the inconvenience of film quality and adhesive property was reflected on durability, a heating resistor as a heater was subjected to measurement of a bubbling voltage and a bubbling durability test with driving conditions of a driving frequency of 10 kHz, a pulse width of 1 μsec, and a driving voltage obtained by multiplying a bubbling voltage by 1.3. As a result, all the samples A to C, which were formed by lift-off, passed the durability tests; however, four of the samples D, which were formed by sputter etching, and two of the samples E, which were formed by mask deposition, became not to bubble.

TABLE 1

| | Second protective film material | Patterning method | Cause of non-foaming |
|---|---|---|---|
| Sample A | Ir | Lift-off (30 seconds over-etching) | |
| Sample B | Ir | Lift-off (60 seconds over-etching) | |
| Sample C | Ir | Lift-off (90 seconds over-etching) | |
| Sample D | Ir | Dry etching | existence of film lifting (two pieces) heater breaking(two pieces) |
| Sample E | Ir | Mask film deposition | heater breaking(two pieces) |

Regarding two of the four samples D which were formed by sputter etching and became not to bubble, it was found that: the heater was not cut; and from the observation of the section, peeling occurred between the first protective film and the second protective film. Further, the Ti film as the adhesion layer could not be identified. For the other two samples, there was breaking of the heater, and a part of the second protective film was removed. Further, as the two samples E, which were formed by mask deposition and became not to bubble, there was breaking of the heater, and a part of the second protective film was removed.

As its cause, it is considered that the second protective film was peeled because an adhesive force thereof was weak due to corrosion of the Ti film or because a tensile force thereof was large. Further, sputter etching has no selection ratio, and thus, the first protective is subjected to etching to some extent. From this, it is considered that the ink penetrates from the first protective film to damage the heater.

It is considered that, in terms of a manufacturing method, a superior durability in lift-off largely results from a shape factor of the edge portion in comparison with any of mask deposition and sputter etching. As a result, the superiority of lift-off with the use of the sacrifice layer is confirmed.

As described above, film formation is performed by lift-off with the use of the Al pattern having a multi-layer film structure with different etching rates, whereby the Ir film with high adhesive property can be obtained. Further, the noble metal thin film made of Ir or the like is used as the protective layer of the element substrate. Thus, the liquid discharge head with high durability performance can be realized.

In the formation of the Al multi-layer film with different etching rates, reactive sputtering with nitrogen may be used instead of reactive sputtering with aluminum oxide. Further, the metal is not limited to Al. The same effect can be obtained by selecting an etchant properly as long as the metal material is one, which is capable of forming an oxide or nitride, such as Cr, Cu, or Mo. Moreover, the sacrifice layer made of an inorganic material such as Al withstands film formation at high temperature, and thus, can be applied to the pattern deposition of the noble metal except Ir, for example, Pt (platinum), Os (osmium), Ru (ruthenium), or Ni (nickel). Furthermore, since these materials often require adhesion, the structure, in which the edge portion having the above shape entirely covers the adhesion layer, is particularly effective.

This embodiment has given the example of the system in which: the heating resistor is used as the energy generator for generating energy used for discharge of a liquid; bubbles is generated by applying heat energy to the liquid such as ink;

and the liquid is discharged through the formation of the bubble. However, the present invention can also be applied to an example in which a piezoelectric element is used as an energy generator.

Figure 8:
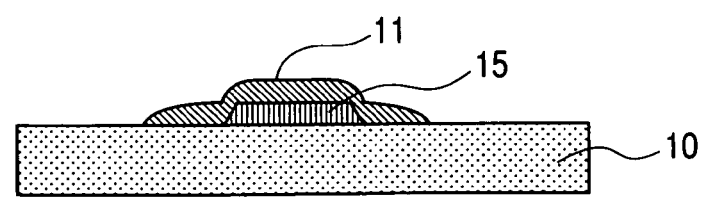
FIG. 8 is a schematic diagram showing a state in which a metal film is formed by lift-off in this embodiment.

Further, according to the present invention, not only in the above case of the formation of the metal film in the recessed portion but also in the case where the metal film 11 is formed on a concave portion 15 on the base 10 as shown in FIG. 8, the metal film is formed such that: the film thickness is reduced toward the end portion; and besides, the corner portions have radiuses as described above. Therefore, there can be formed the metal film which is difficult to be peeled off and has high reliability. Consequently, the film formation method of the present invention is not limited to the thin film of the element substrate of the liquid discharge head, and can be applied to the thin film of the substrate formed of various semiconductor devices, electronics devices, or the like.

This application claims priority from Japanese Patent Application No. 2004-101842 filed on Mar. 31, 2004, which is hereby incorporated by reference herein.

What is claimed is:

1. A liquid discharge head, comprising:

an energy generator which is provided on a substrate and generates energy used for discharging a liquid;

a wiring connected to the energy generator;

an insulating protective film which covers the energy generator and the wiring;

an adhesion layer provided on the insulating protective film; and an endurance protective film provided on the adhesion layer, wherein:

the endurance protective film has a center portion having a predetermined thickness and an edge portion having a thickness distribution in which a thickness is gradually decreased from the predetermined thickness to substantially zero at an edge of the film; and the edge portion covers an end portion of the adhesion layer.

* * * * *